United States Patent [19]
Parham

[11] Patent Number: 5,412,274
[45] Date of Patent: May 2, 1995

[54] DIFFUSELY REFLECTING OPTICAL INTERFERENCE FILTERS AND ARTICLES INCLUDING LAMPS REFLECTORS AND LENSES

[75] Inventor: Thomas G. Parham, Gates Mills, Ohio

[73] Assignee: General Electric Company, Schenectady, N.Y.

[21] Appl. No.: 992,355

[22] Filed: Dec. 17, 1992

[51] Int. Cl.⁶ ............................................. H01K 1/26
[52] U.S. Cl. .................................... 313/112; 313/580; 313/635; 359/582; 359/586; 359/587
[58] Field of Search ............... 313/110, 112, 113, 580, 313/635; 359/582, 586, 587, 589; 422/166, 167; 428/428, 452, 164, 150

[56] References Cited
U.S. PATENT DOCUMENTS

| | | |
|---|---|---|
| 4,524,410 | 6/1985 | Kawakatsu et al. ............... 313/112 |
| 4,634,919 | 1/1987 | Yuge et al. ........................ 313/313 |
| 4,652,789 | 3/1987 | Kawakatsu et al. ............... 313/112 |
| 4,663,557 | 5/1987 | Martin, Jr. et al. ............... 313/112 |
| 4,775,203 | 10/1988 | Vakil et al. ....................... 350/1.7 |
| 4,940,636 | 7/1990 | Brock et al. ....................... 428/432 |
| 5,138,219 | 8/1992 | Krisl et al. ........................ 313/112 |
| 5,143,445 | 9/1992 | Bateman et al. .................. 313/112 |
| 5,267,081 | 11/1993 | Pein .................................. 359/586 |

Primary Examiner—Sandra L. O'Shea
Assistant Examiner—Vip Patel
Attorney, Agent, or Firm—Edward M. Corcoran; Stanley C. Corwin

[57] ABSTRACT

A multilayer optical interference filter having a controlled degree of diffuse reflection over a desired visible wavelength range, includes alternating layers of at least one high refractive index material and at least one low refractive index material, wherein at least one layer of the alternating layers is a light scattering layer comprised of titania which diffusely reflects light over a desired visible wavelength range. The multilayer optical interference filter may be provided by a process including sequentially applying the alternating layers by chemical vapor deposition from respective precursors at temperatures effective to pyrolytically decompose the respective precursors, wherein the precursor of the light scattering layer comprised of titania is at least one branched alkoxide of titania. Vitreous and light transmissive articles, including electric lamps, reflectors, and/or lenses, are provided with a multilayer optical interference filter according to the invention to provide them with a controlled degree of diffuse reflection.

13 Claims, 3 Drawing Sheets

DIFFUSELY REFLECTING OPTICAL INTERFERENCE FILTERS AND ARTICLES INCLUDING LAMPS REFLECTORS AND LENSES

BACKGROUND OF THE INVENTION

1. FIELD OF THE INVENTION

The present invention relates to a multilayer optical interference filter and its use with light transmissive articles including electric lamps, and, more particularly, to a multilayer optical interference filter having a controlled degree of diffuse reflection with respect to a desired visible wavelength range and its use with light transmissive articles including electric lamps, reflectors and/or lenses.

2. BACKGROUND OF THE ART

Thin film optical interference coatings known as optical interference filters are well known to those skilled in the art and comprise alternating layers of two or more materials of different refractive index. Such coatings are used to selectively reflect and/or transmit light radiation from various portions of the electromagnetic spectrum.

These coatings have been found to be useful to improve the illumination efficacy of incandescent and arc lamps by reflecting infrared radiation emitted back to the filament or arc while transmitting the visible light. This lowers the amount of electrical energy required to be supplied to the filament or arc to maintain its operating temperature.

Such films have also been applied to reflectors in the form of what is known in the art as "cold mirrors" and "hot mirrors". A "cold mirror" is an optical filter which reflects visible light while at the same time permitting longer wavelength infrared energy to pass through the filter. This ensures that the light reflected is much cooler than it would otherwise be if both visible and infrared light were reflected. On the other hand, some reflectors contain a reflecting coating on the inside reflecting surface, such as a coating of aluminum, for reflecting essentially all of the radiation emitted by a lamp filament or arc and projecting it forward of the reflector. In this latter case, the projected light is significantly hotter than that obtained with a cold mirror. Finally, a "hot mirror" is an optical filter which reflects infrared radiation while at the same time permitting shorter wavelength visible light to pass through the filter. One application of hot mirrors in the lamp industry has been to return infrared heat to the filament to increase lamp efficiency.

It is often desirable to diffusely scatter light from an intense source, such as an incandescent filament, by providing the envelope of the incandescent lamp with a light diffusing coating. In reflector lamps provided with lenses or reflectors, stippling has been employed on the lenses and facets have been provided on the reflector in order to diffusely reflect the projected filament images.

One such light diffusive coating is disclosed in U.S. Pat. No. 4,869,927 to Kawakatsu et al., the disclosure of which is incorporated herein by reference. A dip-coating method was used to form a light diffusive coating on a halogen lamp envelope by applying an organo-metallic compound combined with a high boiling point solvent to a base and baking so that the organo-metallic compound decomposes to form a metallic oxide coating including bubbles which scatter light formed by the vaporization of the high boiling point solvent. Such a layer may be used alone or included in a multilayer coating consisting of alternating high refractive index layers made of, for example, titania, and low refractive index layers made of, for example, silica.

U.S. Pat. No. 4,663,557 to Martin, Jr. et al., the disclosure of which is herein incorporated by reference, teaches that an 1100° C. post-deposition heat treatment can transform a specularly reflecting tantala/silica optical interference coating provided on a halogen lamp envelope by vacuum deposition such that it will diffusely reflect visible light while continuing to specularly reflect infrared radiation.

It is therefore an object of the present invention to provide a multilayer optical interference filter having a controlled degree of diffuse reflection with respect to a desired visible wavelength range.

It is another object of the present invention to provide an article which is vitreous and light transmissive with a multilayer optical interference filter having a controlled degree of diffuse reflection over a desired visible wavelength range, such as a reflector or lens, useful, for example, with an electric lamp.

It is yet another object of the present invention to provide an electric lamp including a multilayer optical interference filter having a controlled degree of diffuse reflection over a desired visible wavelength range provided on its lamp envelope and/or on a reflector and/or lens associated with the lamp.

SUMMARY OF THE INVENTION

These and other objects are accomplished by the present invention which provides a multilayer optical interference filter having a controlled degree of diffuse reflection over a desired visible wavelength range, comprising alternating layers of at least one high refractive index material and at least one low refractive index material, wherein at least one layer, and preferably at least two layers, of the alternating layers is a light scattering layer comprised of titania which diffusely reflects light over a desired visible wavelength range. In most embodiments, the multilayer optical interference filter is provided on a substrate or article which is vitreous and light transmissive.

In one embodiment, the optical interference coating is provided by a process comprising sequentially applying the alternating layers by chemical vapor deposition from respective precursors at temperatures effective to pyrolytically decompose the respective precursors, wherein the precursor of the light scattering layer comprised of titania is at least one branched alkoxide of titania.

The present invention additionally provides an electric lamp and an article, such as a reflector or a lens, including a multilayer optical interference filter according to the present invention, as well as such an electric lamp provided with such a reflector and/or lens.

DETAILED DESCRIPTION OF THE PREFERRED EMBODIMENTS

Figure 4:
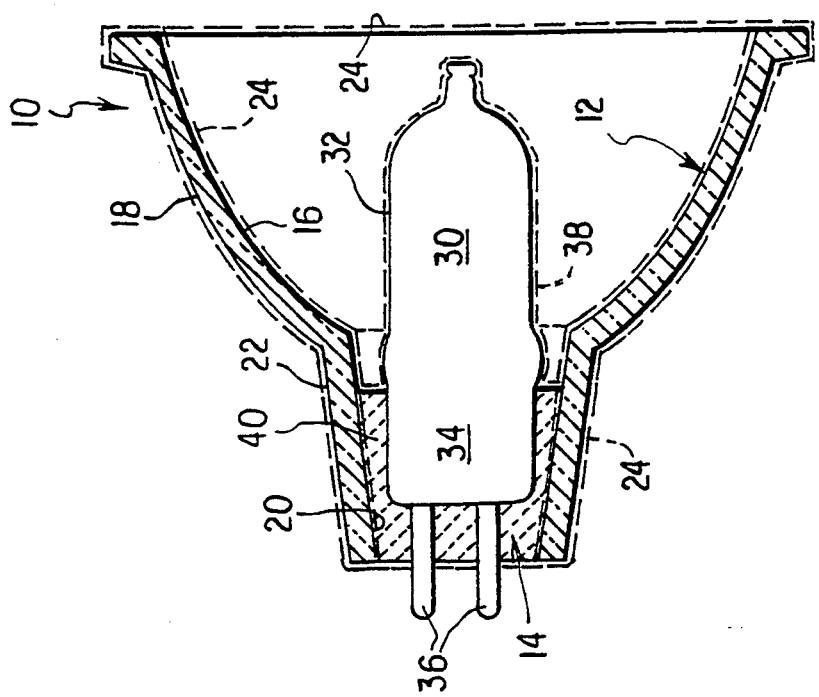
FIG. 4 is an electric lamp provided with a reflector, both of which include multilayer optical interference filters according to the present invention.

The present invention rests upon the discovery that highly scattering films of titania having very low optical absorption can be deposited by CVD from branched alkoxide precursors, for example, titanium isopropoxide or titanium isobutoxide, whereas titania films deposited from linear alkoxides, such as titanium ethoxide, titanium, n-propoxide, or titanium n-butoxide, are non-scattering and have a high optical absorption as deposited.

Thus, optical interference coatings may be prepared which are diffusely reflecting in a desired visible wavelength range because they include these highly scattering films of titania. While any metal oxide known in the optical interference filter art may be used for such coatings, such as titania, tantala, niobia, hafnia, zirconia, yttria, etc., in one embodiment, the metal oxides are selected from the group consisting essentially of titania, tantala, hafnia and niobia. Most preferably, the low refractive index material is silica and the high refractive index material is titania, it being noted that a material having a high refractive index, as used herein, refers to a material which has a refractive index which is higher than that of the low refractive index material. However, titania may be the low refractive index material.

In one embodiment, the multilayered coating according to the present invention is applied by a CVD or LPCVD coating process in which sequential deposition of the alternating layers from respective precursors is conducted at a temperature effective to pyrolytically decompose (and/or react) the respective precursors. Typical temperatures employed range from 350 to 600° C. and typical pressures employed range from 10 m torr to 5 torr. Chemical vapor deposition techniques, including low pressure chemical vapor deposition techniques, are well known to those skilled in the art and are disclosed in, for example, U.S. Pat. Nos. 4,006,481; 4,211,803; 4,393,097; 4,435,445; 4,508,054; 4,565,747 and 4,775,203.

The precursor for the light scattering layer(s) comprising titania is at least one branched alkoxide of titania, including titanium isopropoxide, titanium isobutoxide, titanium isopentoxide, etc. The precursors for the other metal oxides include linear and branched metal alkoxides, and, for the purposes of this disclosure, silica is considered a "metal oxide". The precursors for silica include alkoxides and silanes, while most preferably the precursor is a silane. The preferred precursors for the other metal oxides are metal alkoxides, particularly linear alkoxides, although branched alkoxides are also suitable for preparing most metal oxides except titanium for which a linear alkoxide precursor should be used for titania layers which are to be non-scattering. Applicant has found that CVD coating, particularly LPCVD coating of a branched alkoxide of titanium, produces titania layers which are characteristically diffusely reflecting, at commercially viable deposition rates ranging between about 0.5 to about 10 angstroms per second and to a layer thickness in excess of about 500 angstroms.

As is known in the art, any or all of the various metal oxide layers may contain dopants in amounts effective to, for example, vary the refractive index and/or reduce stress.

For an LPCVD process, in general, a deposition chamber with heating means is evacuated and one or more suitable organometallic precursor of or reagents for the desired metal oxide, such as titania or silica, in the vapor state is permitted to flow through the deposition chamber by any suitable means. When a precursor reagent flows into the deposition chamber, it is decomposed to deposit respective films of titania and silica on the substrate. Individual layers of titania and silica can be uniformly deposited employing this process and have been successfully deposited on both flat and curved substrates, such as lamp envelopes, reflectors, and lenses. Uniform layers of titania and silica (and other metal oxides as well) can be formed ranging from about 100 to 100,000 Å in thickness. When the desired film thickness is achieved, the flow of precursor(s) is stopped, the chamber evacuated, and the precursor reagent for another material is flowed into the deposition chamber until the desired thickness of that material is achieved. The process is repeated until the desired multiple layer optical interference coating or filter is formed.

As an artisan would know, a variety of coating methods are known which are suitable for providing multilayer thin films of metal oxides. These include, for example, vacuum deposition, and deposition from solutions or suspensions of precursors by spraying, spinning, or dipping followed by heating to remove solvent and pyrolyze the precursors. Any of these known methods may be employed alone or in combination to provide multilayer filters according to the invention. Vacuum deposition techniques, however, would not be expected to provide the light scattering layers comprised of titania.

Moreover, the degree of diffuse reflection can be controlled over a designed wavelength range by varying the number and/or position in the stack of light scattering layers comprising titania included in the optical interference coating. Thus, at least one, and preferably at least two, such scattering titania layers are included, with the remainder of titania layers, if any, being non-scattering titania layers. Whether scattering or non-scattering, however, all of these titania layers have the refractive index characteristic of titania, namely, 2.54 determined at 600 nm.

Optical interference coatings according to the present invention are designed by the well-known techniques of the optical interference art to selectively reflect and transmit different portions of the electromagnetic spectrum. For example, when the multilayer filter specularly reflects infrared radiation, the at least one light scattering layer of titania, which diffusely reflects radiation over a designed wavelength range, is designed to diffusely reflect visible radiation.

Illustrative, but non-limiting examples of compounds suitable for use in the present invention for depositing a silica film by CVD, preferably by LPCVD, include tetraethoxy silane, diacetoxy dibutoxy silane, tetraacetoxy silane and silicon tetrakis diethyloxyamine. Suitable reagents for depositing a film of tantala include tantalum ethoxide, tantalum isopropoxide, tantalum methoxide, tantalum butoxide, and tantalum pentachloride and water and/or oxygen. Titanium tetraethoxide, titanium n-propoxide, titanium isopropoxide, titanium isobutoxide and titanium isopentoxide are suitable reagents for depositing titania, and pentaethyl niobiate is useful for depositing niobia.

Figure 1:
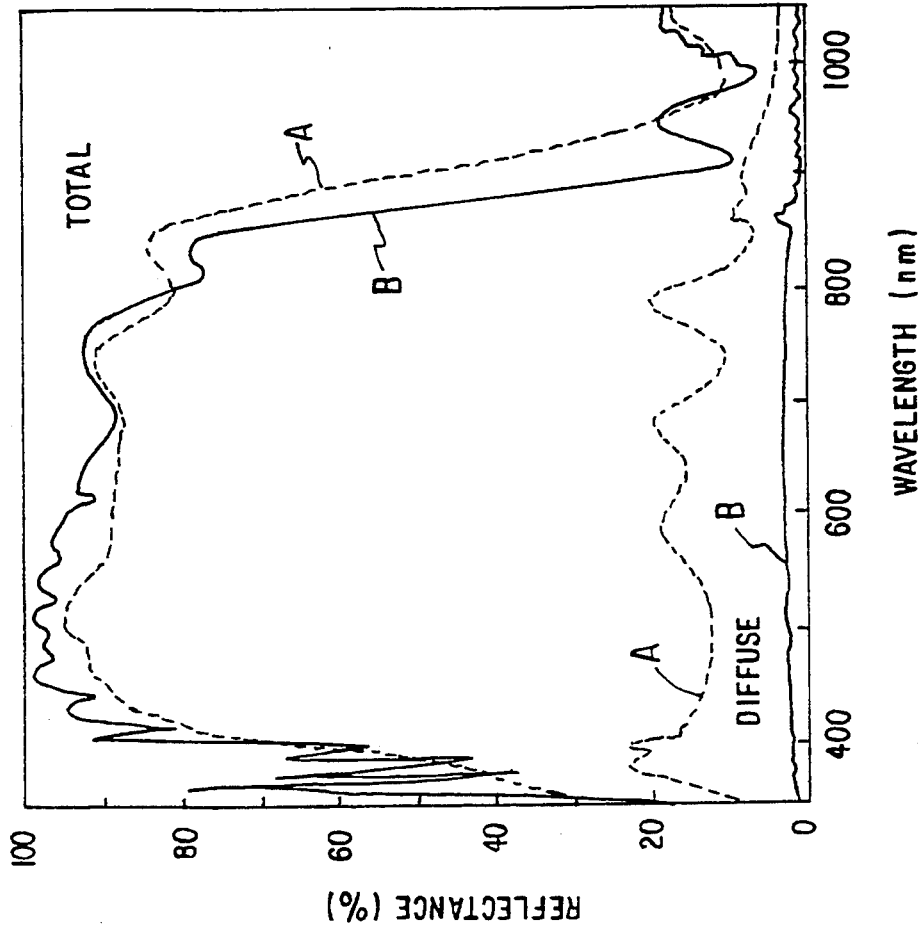
FIG. 1 is a graph of total and diffuse reflectance for titania/silica cold mirrors comparing an inventive cold mirror including diffusely reflecting titania layers deposited from titanium isopropoxide (curves A) with an equivalent cold mirror including 15 non-scattering titania layers deposited from titanium ethoxide (curves B)

FIG. 1 is a graph showing total and diffuse reflectance for two cold mirrors having 15 layers of titania alternating with 15 layers of silica. The cold mirrors are glass reflectors which were LPCVD coated with alternating layers of titania and silica under similar conditions except that the titania layers in one mirror were coated from titanium isopropoxide according to the invention while the titania layers of the other were coated from titanium ethoxide. FIG. 1 demonstrates the significantly greater diffuse reflectance for titania deposited according to the invention from the isopropoxide (curves A) compared to titania deposited from the ethoxide (curves B).

As shown in FIG. 1, both of the cold mirrors have essentially identical total reflectance but the inventive mirror (curve A) has about 20% diffuse backward scattering whereas the comparative mirror (curve B) has essentially no diffuse reflection. Notably, while the inventive mirror has significant losses due to scattering, the comparative mirror has a similar level of loss due to optical absorption. These two substantial differences, optical absorption versus optical scattering, are believed to be related to the growth habit of the film as it is deposited from the thermally decomposing titanium alkoxide.

Figure 2:
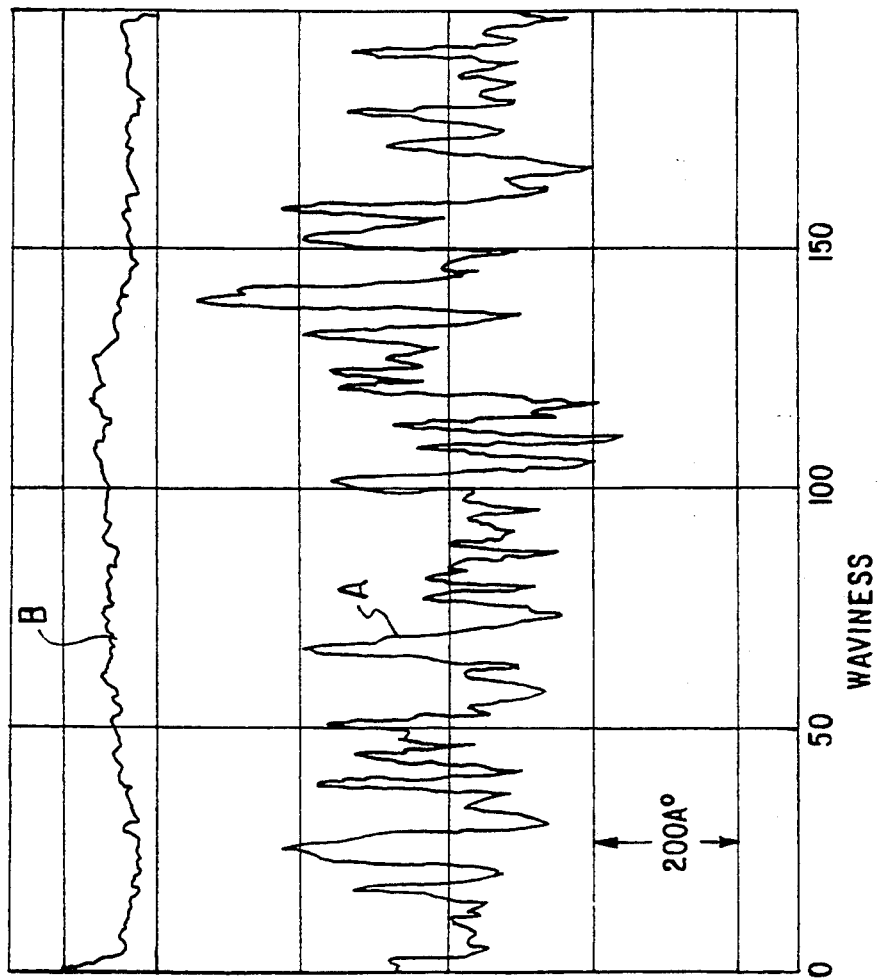
FIG. 2 is a profilometer scan comparing the surface roughness of a diffusely scattering titania layer deposited according to the invention from a branched alkoxide of titanium (A) and a non-scattering titania layer deposited from a linear alkoxide of titanium (B)

FIG. 2 is a profilometer scan taken over a lateral distance of 200 microns comparing the surface roughness of an inventive titania single layer film deposited by LPCVD from titanium isopropoxide (curve A) with that of a single layer film deposited under similar conditions but using titanium ethoxide (curve B). The surface of the inventive film (curve A) is clearly much rougher than the surface of a film deposited from a linear alkoxide and, while not wishing to be held to any particular theory, this substantially greater roughness of the isopropoxide deposited layer, curve A wherein the peak-to-valley distances are on the order of 200 Å, is believed to result from the presence and size of the anatase grains of titania discussed below. This combination of anatase crystal size and the surface roughness of the titania layer is believed to account for the significantly greater optical scattering noted for titania films deposited according to the invention from branched alkoxides. Indeed, scanning electron microscope photographs and X-ray diffraction patterns of these titania films show that the titania film deposited from titanium isopropoxide has grains of highly crystalline anatase titania having both lateral dimensions, (within the plane of the layer) large enough to optically interact with visible light, which means that both lateral dimensions, or the effective diameter of the grains, are greater than 0.4 microns. The minimum lateral dimensions or effective diameter has been found to be typically on the order of from 0.6 to 1 micron. The titania film deposited from titanium ethoxide has virtually no visible grain structure for the microcrystalline anatase titania. Transmission electron microscopy studies conducted as part of the experimental work defining the invention have shown that films grown from the ethoxide consist of 300 to 500 Å anatase crystallites which are too small to scatter visible light.

In the titania films deposited from the isopropoxide, the large crystals scatter visible light due to grain boundary scattering and, when such a film is included in a multilayer optical interference filter, the filter diffusely reflects light in accordance with the wavelength of light the optical interference filter was designed to reflect. Thus, in addition to specular reflection, diffuse reflection is achieved by the present invention, and the amount of diffuse reflection can be varied by varying the number of light scattering layers comprised of titania from one to all and/or by varying the position in the stack of the light scattering layers.

Figure 3:
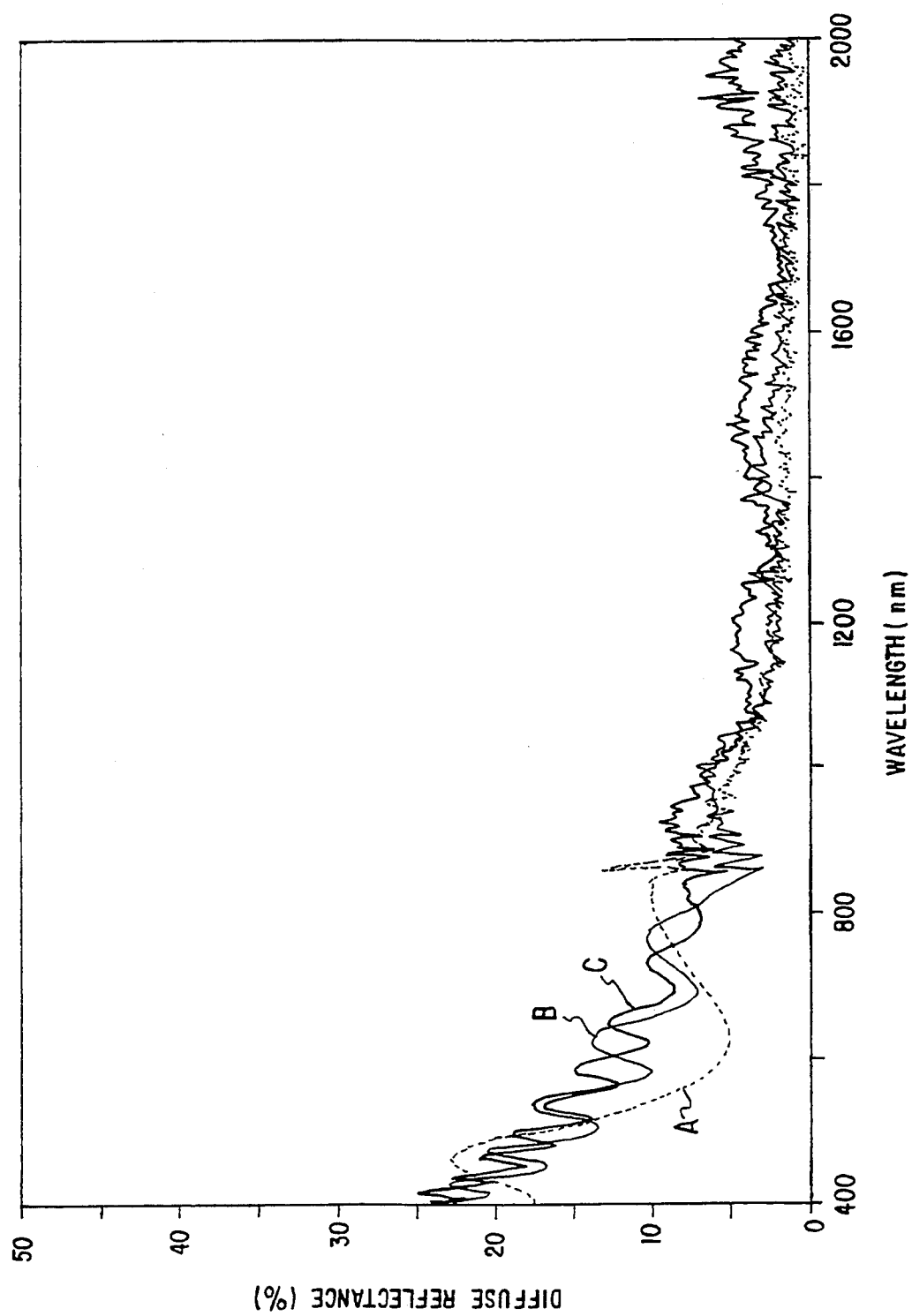
FIG. 3 is a graph of diffuse reflectance versus wavelength for three single layer titania coatings according to the present invention having thicknesses ranging over a factor of six.

FIG. 3 is a graph of diffuse reflectance versus wavelength for three, single layer titania films deposited from titanium isopropoxide. Film A has a thickness of 1,750 Å; film B has a thickness of 6,800 Å; and film C has a thickness of 10,500 Å. Backward diffuse scattering is not shown, but was found to be nearly identical for these films which differ only in thickness and have a range of film thicknesses which varies by a factor of six. Interestingly, all of the films show a high level of optical scattering which is primarily of a Rayleigh scattering type. It is significant to note that the scattering for all three films is substantially identical even though the range of film thicknesses varies by more than a factor of six. This is believed to suggest that the scattering is surface related rather than being a bulk film quality. That is, the diffusion or light scattering, both terms being used synonymously herein, has been found to be a surface-related, rather than a bulk-related, phenomena which is controlled by the surface of the light scattering layer at its interface with another layer or air.

FIG. 4 schematically illustrates a glass reflector 10 and an electric lamp 30 in accordance with the present invention. Reflector 10 is shown in cross-section and includes a parabolic portion 12 and a rearwardly projecting portion 14 defining a cavity. Parabolic portion 12 has an inner surface 16 and an outer surface 18. Rearwardly projecting portion 14 has an inner surface 20 and an outer surface 22. All surfaces of reflector 10 are shown coated with an optical interference filter 24 according to the present invention, however, certain applications may require coating of only select portions. Lamp 30 is shown in elevation and includes a vitreous envelope 32 hermetically sealed at 34 by means of a customary pinch seal or shrink seal and having exterior leads 36. Lamp envelope 32 is provided with a multilayer optical interference filter 38 which diffusely scatters visible light. Lamp 30 is cemented into cavity 14 of reflector 10 by cement 40.

Lamp and reflector combinations of this type, but having a prior art optical interference filter provided, for example, only on the interior surfaces of the reflector, are known to those skilled in the art, as are suitable cements for securing lamp 30 in reflector 10 (see, for example, U.S. Pat. No. 4,833,576, the disclosure of which is incorporated herein by reference). Lamp 30 is shown schematically as an incandescent lamp and also contains a filament and inleads (not shown) within envelope 32. The invention is not limited to incandescent electric lamps, however, and also extends to arc lamps (not shown). When energized, lamp 30 emits light, most of the visible portion of which is diffusely reflected by coating 24 on the interior surface 16 and exterior surface 18 of parabolic portion 12. At the same time, most of the infrared portion of the emitted light is transmitted through coating 24 and out of reflector 10.

EXAMPLE 1

The following is a theoretical design for a titania/silica cold mirror having 30 layers. Layers 1-30 are numbered starting at the substrate and thicknesses are given in angstroms. The high refractive index material (H) is titania having a refractive index of about 2.54 and the low refractive index material (L) is silica having a refractive index of about 1.45. Refractive indices were determined at 600 nm.

| 1 | 649.0 | H | 16 | 1083.0 | L |
|---|---|---|---|---|---|
| 2 | 1406.0 | L | 17 | 569.0 | H |
| 3 | 504.0 | H | 18 | 1148.0 | L |
| 4 | 1573.0 | L | 19 | 516.0 | H |
| 5 | 567.0 | H | 20 | 1073.0 | L |
| 6 | 1553.0 | L | 21 | 526.0 | H |
| 7 | 547.0 | H | 22 | 984.0 | L |
| 8 | 1631.0 | L | 23 | 422.0 | H |
| 9 | 500.0 | H | 24 | 839.0 | L |
| 10 | 1610.0 | L | 25 | 453.0 | H |
| 11 | 657.0 | H | 26 | 867.0 | L |
| 12 | 1204.0 | L | 27 | 337.0 | H |
| 13 | 612.0 | H | 28 | 934.0 | L |
| 14 | 1281.0 | L | 29 | 227.0 | H |
| 15 | 577.0 | H | 30 | 1649.0 | L |

EXAMPLE 2

A cold mirror according to the present invention was fabricated and employed the 30-layer optical design of Example 1 including alternating layers of titania and silica. Silica was coated from diacetoxy dibutoxy silane and titania was coated from titanium isopropoxide, both by an LPCVD process. All of the titania layers in this embodiment were diffusely reflecting, but the amount of diffusely reflected light can be controlled by reducing the number and varying the position in the stack of diffusely reflecting titania layers. This is accomplished by coating at least one, but up to all but one, titania layer from linear alkoxide precursors by LPCVD. Such layers are non-scattering.

Thus, with reference to FIG. 4, a cold mirror, glass reflector 10, was prepared by applying a multilayer optical interference filter to the interior and exterior surfaces employing a low pressure vapor deposition coating process. The cold mirror was a 30-layer optical design of alternating layers of titania and silica, 15 layers total of each. Suitable metal oxide precursor reagents for each material were separately and sequentially introduced into a decomposition chamber wherein the precursor reagent decomposed to form the respective metal oxide on a heated substrate. Thus, separate layers of titania and silica were applied onto a glass reflector to thicknesses in accordance with the 30-layer optical design in this fashion until the desired optical interference coating was achieved.

In forming the alternating layers of titania and silica on a glass reflector in accordance with the preferred embodiment of the present invention, glass reflector 10 was positioned within a deposition chamber. The chamber was contained within a furnace so that the glass substrate reached the temperature required to achieve decomposition of the respective precursors and concomitant deposition of the respective metal oxide films of titania or silica onto the glass substrate, reflector 10. These temperatures will generally range between about 350°-600° C., depending upon the particular reagent used. While the metal oxides titania and silica have been used in this example and are preferred materials, other metal oxides, may be employed in keeping with the optical design appropriate to the intended application.

No carrier gas is required in the deposition chamber to facilitate movement of the reagent through the chamber, although an inert carrier gas can also be employed, if desired. The pressure in the chamber during the deposition process will, in general, range between about 0.1-5.0 torr, depending upon the reagent used and the temperature of the substrate. The flow rate of the gaseous reagent in the deposition chamber will generally range between about 10-2,000 SCCM, depending upon the size of the reaction chamber, the reagent, presence of a carrier gas and desired rate of deposition, etc.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A multilayer optical interference filter having a controlled degree of diffuse reflection over a desired visible wavelength range comprising a plurality of alternating layers of high and low refractive index materials, said high refractive index material being a material having a refractive index higher than that of said low refractive index material, wherein at least one layer of said alternating layers is a light scattering layer comprising titania which contains titania crystals having an effective diameter greater than 0.4 micron in the plane of said layer and wherein at least one of said light scattering titania layers has a surface roughness wherein the peak-to-valley distances exceed 100 Å.

2. An optical interference filter according to claim 1 wherein said high refractive index material comprises at least one metal oxide and wherein said low refractive index material comprises silica.

3. An optical interference filter according to claim 2 wherein said high refractive index material comprises titania.

4. An optical interference filter according to claim 1 wherein said high refractive index material comprises metal oxide and wherein said low refractive index material comprises titania.

5. An article comprising a vitreous, light-transmissive substrate supporting a multilayer optical interference filter provided on at least a portion of at least one surface of said article which provides a controlled degree of diffusion reflection over a desired visible wavelength range an which comprises alternating layers of high and low refractive index materials, said high refractive index material being a material having a refractive index higher than that of said low refractive index material, wherein at least one of said alternating layers is a light scattering layer comprising titania which contains titania crystals having an effective diameter greater than 0.4 micron in the plane of said layer and wherein said light scattering titania layers have a surface roughness wherein the peak-to-valley distances exceed 100 Å.

6. An article according to claim 5 wherein said substrate is selected from the group consisting essentially of a reflector and a lens.

7. An article according to claim 6 in combination with an electric lamp.

8. An article according to claim 5 wherein said high refractive index material comprises at least one metal oxide and wherein said low refractive index material comprises silica.

9. An article according to claim 8 wherein said high refractive index material comprises titania.

10. An article according to claim 5, wherein said high refractive index material comprises metal oxide and wherein said low refractive index material comprises titania.

11. An electric lamp, comprising a light transmissive, vitreous envelope enclosing an electric light source and a multilayer optical interference filter on at least a portion of the surface of said envelope comprising a plurality of alternating layers of high and low refractive index materials, said high refractive index material being a material having a refractive index higher than that of said low refractive index material, wherein at least one of said alternating layers comprises a light scattering titania layer containing titania crystals having an effective diameter greater than 0.4 micron in the plane of said layer and wherein said light scattering titania layers have a surface roughness wherein the peak-to-valley distances exceed 100 Å.

12. An electric lamp according to claim 11 wherein said high refractive index material comprises titania.

13. An electric lamp according to claim 11 wherein both said high and low refractive index materials comprise one metal oxide and wherein said low refractive index material comprises titania.

* * * * *